United States Patent
Vimercati

(10) Patent No.: US 12,131,766 B2
(45) Date of Patent: *Oct. 29, 2024

(54) MEMORY ARRAY WITH MULTIPLEXED SELECT LINES AND TWO TRANSISTOR MEMORY CELLS

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/675,686

(22) Filed: Feb. 18, 2022

(65) Prior Publication Data

US 2022/0172765 A1    Jun. 2, 2022

Related U.S. Application Data

(63) Continuation of application No. 16/831,116, filed on Mar. 26, 2020, now Pat. No. 11,276,448.

(51) Int. Cl.
*G11C 11/22* (2006.01)
(52) U.S. Cl.
CPC ........ *G11C 11/2259* (2013.01); *G11C 11/221* (2013.01); *G11C 11/2273* (2013.01)
(58) Field of Classification Search
None
See application file for complete search history.

(56) References Cited

U.S. PATENT DOCUMENTS

| | | | | |
|---|---|---|---|---|
| 4,086,662 A | * | 4/1978 | Itoh | G11C 11/403 |
| | | | | 365/210.1 |
| 4,198,694 A | * | 4/1980 | Eaton, Jr. | H01L 23/535 |
| | | | | 365/183 |

(Continued)

FOREIGN PATENT DOCUMENTS

| | | |
|---|---|---|
| JP | 04-006692 A | 1/1992 |
| JP | 2009-259337 A | 11/2009 |

(Continued)

OTHER PUBLICATIONS

ISR/KR, International Search Report and Written Opinion of the International Searching Authority, Int'l Appl. No. PCT/US2021/022897, Jul. 7, 2021, Korean Intellectual Property Office, Seo-gu, Daejeon, Republic of Korea, 9pgs.

(Continued)

*Primary Examiner* — J. H. Hur
(74) *Attorney, Agent, or Firm* — Holland & Hart LLP

(57) ABSTRACT

Methods, systems, and devices for memory array with multiplexed select lines are described. In some cases, a memory cell of the memory device may include a storage component, a first transistor coupled with a word line, and a second transistor coupled with a first select line to selectively couple the memory cell with a first digit line. A third transistor may be coupled with the first digit line and a sense component common to a set of digit lines and a set of select lines. A second select line may be coupled with the third transistor and configured to couple the sense component with the first digit line and to couple the sense component with a second digit line. The sense component may determine a logic state stored by the memory cell based on the signal from the first digit line and the signal from the second digit line.

14 Claims, 6 Drawing Sheets

(56) References Cited

U.S. PATENT DOCUMENTS

| | | | |
|---|---|---|---|
| 4,704,705 A * | 11/1987 | Womack | H10B 12/00 257/E27.084 |
| 4,984,201 A | 1/1991 | Sato et al. | |
| 5,325,325 A * | 6/1994 | Azuma | G11C 7/20 365/174 |
| 5,475,638 A | 12/1995 | Anami et al. | |
| 5,831,907 A | 11/1998 | Trimberger | |
| 5,936,881 A | 8/1999 | Kawashima et al. | |
| 6,016,268 A | 1/2000 | Worley | |
| 6,272,054 B1 * | 8/2001 | Barth, Jr. | G11C 7/06 365/207 |
| 6,344,990 B1 * | 2/2002 | Matsumiya | G11C 11/4097 365/205 |
| 6,404,667 B1 | 6/2002 | Yoo | |
| 6,563,730 B1 | 5/2003 | Poplevine et al. | |
| 7,391,640 B2 | 6/2008 | Tang et al. | |
| 8,619,471 B2 | 12/2013 | Tanzawa | |
| 8,995,180 B2 | 3/2015 | Romanovskyy | |
| 10,020,311 B1 | 7/2018 | Li et al. | |
| 11,276,448 B2 * | 3/2022 | Vimercati | G11C 11/2255 |
| 2004/0184304 A1 * | 9/2004 | Kajigaya | G11C 29/50 257/E21.656 |
| 2005/0122765 A1 | 6/2005 | Allen et al. | |
| 2008/0055958 A1 | 3/2008 | Takemura et al. | |
| 2010/0097839 A1 | 4/2010 | Kim | |
| 2011/0002159 A1 | 1/2011 | Suzuki et al. | |
| 2016/0276409 A1 | 9/2016 | Liu et al. | |
| 2017/0117283 A1 | 4/2017 | Matsuzaki et al. | |
| 2017/0352418 A1 | 12/2017 | Bertin et al. | |
| 2017/0372758 A1 | 12/2017 | Hsiao | |
| 2019/0018917 A1 | 1/2019 | Dai et al. | |
| 2019/0067206 A1 * | 2/2019 | Bedeschi | G11C 11/2253 |
| 2020/0327926 A1 | 10/2020 | Bedeschi et al. | |

FOREIGN PATENT DOCUMENTS

| | | |
|---|---|---|
| JP | 2011-014754 A | 1/2011 |
| WO | 2019/046051 A1 | 3/2019 |

OTHER PUBLICATIONS

Jul. 2021, Korean Intellectual Property Office, Seo-gu, Daejeon, Republic of Korea, 9 pgs.

Japan Patent Office, "Office Action," issued in connection with Japan Patent Application No. 2022-557639 dated Oct. 31, 2023 (13 pages) (7 pages of English Translation and 6 pages of Original Document).

* cited by examiner

MEMORY ARRAY WITH MULTIPLEXED SELECT LINES AND TWO TRANSISTOR MEMORY CELLS

CROSS REFERENCE

The present Application for Patent is a continuation of U.S. patent application Ser. No. 16/831,116 by Vimercati et al., entitled "MEMORY ARRAY WITH MULTIPLEXED SELECT LINES AND TWO TRANSISTOR MEMORY CELLS," filed Mar. 26, 2020, assigned to the assignee hereof, and is expressly incorporated by reference in its entirety herein.

BACKGROUND

The following relates generally to one or more memory systems and more specifically to a memory array with multiplexed select lines.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. Improved solutions for saving space in the memory array, increasing the memory cell density, or decreasing overall power usage of the memory array may be desired.

DETAILED DESCRIPTION

Figure 1:
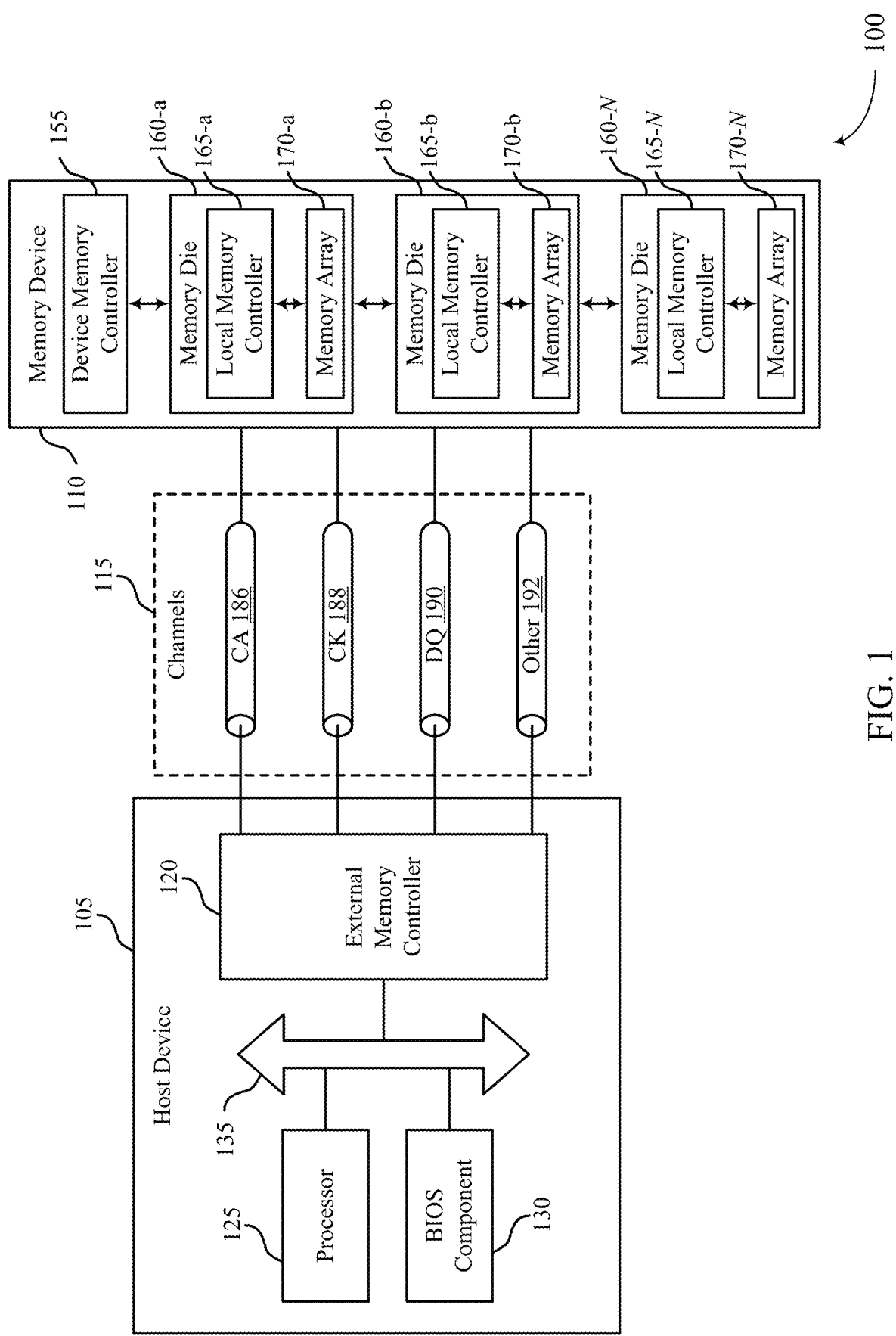
FIG. 1 illustrates an example of a system that supports a memory array with multiplexed select lines in accordance with examples as disclosed herein.

Some memory devices may include an array of memory cells coupled with digit lines. The memory cells may be coupled with a sense component using the digit lines to perform access operations on the memory cells (e.g., a write operation or a read operation). As distances between digit lines decrease to increase a density of the array, some undesired effects (e.g., noise) may increase. For example, when a digit line is activated during an access operation (e.g., selected and coupled with a memory cell), a voltage change associated with the activated digit line may be partially transferred (e.g., capacitively coupled) to neighboring unselected digit lines. As a result, noise may be injected through the unselected portions of the memory array into a selected digit line during the access operation. The memory array may include a one or more switch transistors to mitigate such undesired effects. The switch transistors may be used to reduce disturbances between selected and unselected digit lines. However, the switch transistors and associated switch lines may increase a size of the memory die area used by the memory array and increase the overall power usage of the memory array.

Systems, devices, and techniques are described herein to mitigate disturbances between selected digit lines and unselected digit lines during an access operation and to reduce a quantity of switch lines or switch transistors (or both) used in a memory array. For example, a sense component of memory device may be coupled with a set of select lines. In such cases, the set of select lines may be multiplexed with the input of the sense component. For example, each select line of the set may be coupled with a transistor configured to selectively couple that particular select line of the set with the sense component—e.g., multiplexed select lines associated with the sense component. Further, the select line may be coupled with one or more of the transistors of the selection component of a memory cell and the sense component. In such examples, the sense component may be configured to access memory cells associated with more than one digit line. In such cases, a single select line may be configured to couple at least two digit lines with a sense component at a time, including a selected digit line and an unselected digit line, thereby reducing the size of the die area used by the memory array as compared with other solutions. In some cases, the sense component may be configured to use both a signal from the selected digit line and a signal from the unselected digit line to perform a read operation, thereby decreasing the overall power usage of the memory array.

Features of the disclosure are initially described in the context of memory systems and dies as described with reference to FIGS. 1-2. Features of the disclosure are described in a context circuit diagram and memory cell structures as described with reference to FIGS. 3-4. These and other features of the disclosure are further illustrated by and described with reference to an apparatus diagram and a flowchart that relate to memory array with multiplexed select lines as described with references to FIGS. 5-6.

FIG. 1 illustrates an example of a system 100 that supports memory array with multiplexed select lines in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

In some cases, the memory array 170 may include one or more memory cells that each include a storage component. The memory cells may also include a first transistor coupled with a word line and a second transistor coupled with a select line. To select a memory cell both the first transistor and the second transistor of the memory cell may be activated at a same time, thereby reducing a quantity of switch lines such that at least two digit lines may be coupled with a sense component at a time (e.g., including a selected digit line and an unselected digit line).

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some cases, the device memory controller 155 may bias the word line to activate the first transistor of the memory cell coupled with the word line and bias the select line to activate the second transistor of the memory cell coupled with the select line. The device memory controller 155 may couple the storage component of the memory cell with the digit line and bias a second select line to activate a third transistor coupled with the digit line and a fourth transistor coupled with a second digit line. In such cases, the device memory controller 155 may couple the digit line and the second digit line with a sense component. The sense component may determine a logic state stored on the memory cell based on a signal received from the digit line and a signal received from the second digit line.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
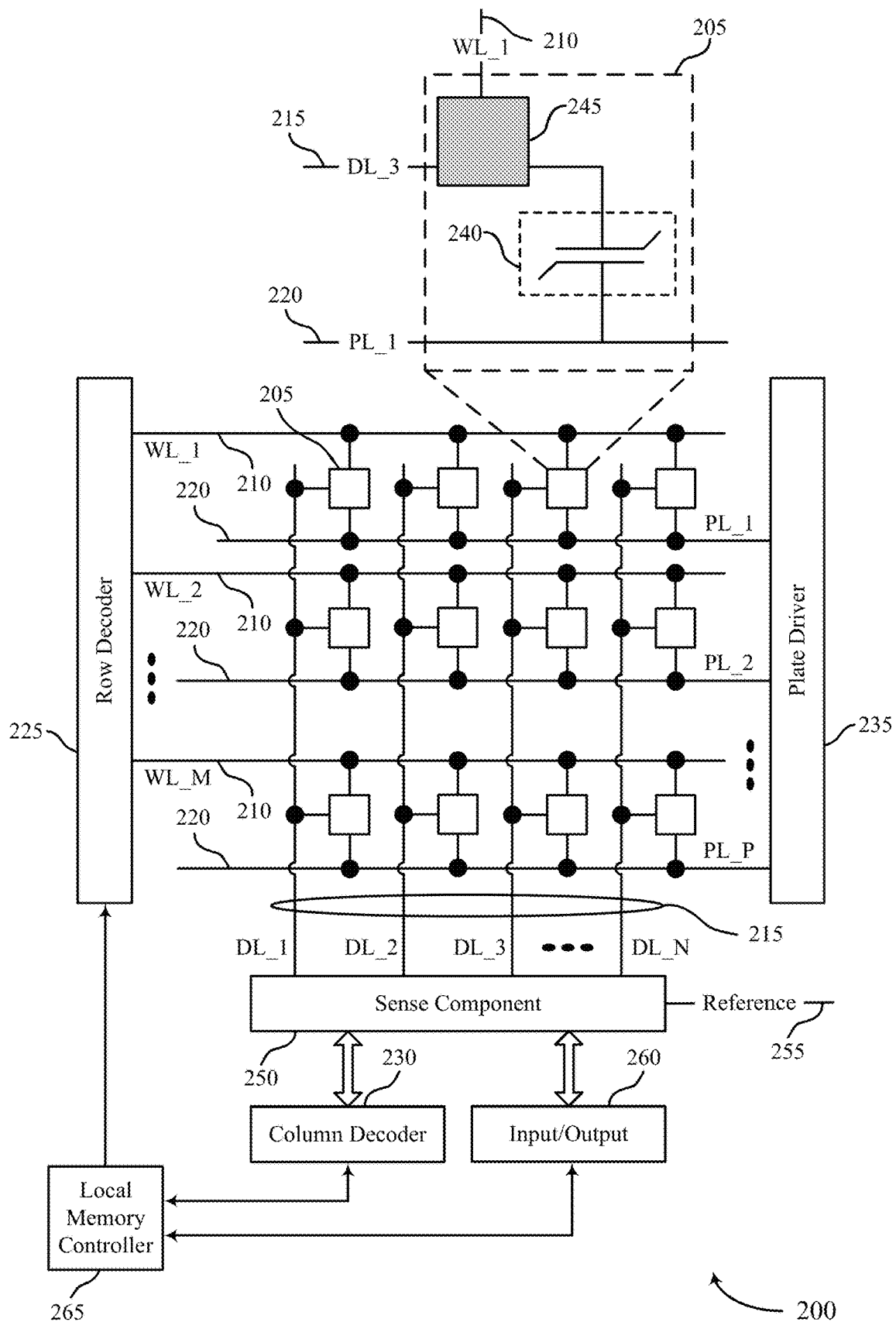
FIG. 2 illustrates an example of a memory die that supports a memory array with multiplexed select lines in accordance with examples as disclosed herein.

FIG. 2 illustrates an example of a memory die 200 that supports memory array with multiplexed select lines in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. In some cases, such a capacitor may be alternatively referred to as a container (or a cell container).

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a storage component 240 (e.g., a capacitor, a container) and a selection component 245 (which may be referred to as a switching component). The selection component 245 may include one or more transistors (e.g., two transistors connected in a series configuration) or any other type of switch devices that selectively establishes or de-establishes electronic communication between two components. A first node of the storage component 240 may be coupled with the selection component 245 and a second node of the storage component 240 may be coupled with a voltage source. In some cases, the voltage source may be the cell plate reference voltage, such as Vpl, or may be ground, such as Vss. In some cases, the voltage source may be an example of plate line 220 coupled with a plate line driver. The selection component 245 may be further coupled with a select line that is omitted in FIG. 1 to improve clarity of illustrating the components. In such cases, the select line may be configured to selectively couple the memory cell 205 with the digit line 215. Examples of configurations for the selection component 245 are described with reference to FIGS. 3 and 4A through 4D.

Selecting or deselecting the memory cell 205 may be accomplished by activating or deactivating the selection component 245. In other words, the storage component 240 may be in electronic communication with the digit line 215 using the selection component 245. For example, the storage component 240 may be isolated from digit line 215 when the selection component 245 is deactivated, and the storage component 240 may be coupled with digit line 215 when the selection component 245 is activated. In some cases, the selection component 245 include at least a transistor and its operation may be controlled by applying a voltage to the transistor gate, where the voltage differential between the transistor gate and transistor source may be greater or less than a threshold voltage of the transistor. In some cases, the selection component 245 may include a p-type transistor or an n-type transistor. In some cases, the selection component 245 may include at least a vertical transistor. The word line 210 may be in electronic communication with the gate of the selection component 245 and may activate/deactivate the selection component 245 based on a voltage being applied to word line 210.

In some cases, the selection component 245 of memory cell 205 may include two transistors (e.g., a first transistor and a second transistor). In such cases, selecting the memory cell 205 may include biasing the word line 210 coupled with the first transistor of the selection component 245. Biasing the word line 210 may also select additional memory cells 205 coupled with the biased word line 210. Further, coupling the selected memory cell 205 with the digit line 215 may include biasing the select line coupled with the second transistor of selection component 245. In this manner, selecting the memory cell 205 and coupling the selected memory cell 205 may include activating the first transistor and the second transistor of the selection component 245. In other words, additional memory cell 205 that has been selected by the biased word line 210 (e.g., the first transistor of the selection component 245 is activated) may remain decoupled with their respective digit lines 215 (e.g., the second transistor of the selection component 245 is deactivated).

A word line 210 may be a conductive line in electronic communication with a memory cell 205 that is used to perform access operations on the memory cell 205. In some architectures, the word line 210 may be in electronic communication with a gate of a selection component 245 (e.g., a gate of the first transistor) of a memory cell 205 and may be operable to control the selection component 245 of the memory cell. In some architectures, the word line 210 may be in electronic communication with a node of the capacitor of the memory cell 205 and the memory cell 205 may not include a selection component.

A digit line 215 may be a conductive line that connects the memory cell 205 with a sense component 250. In some architectures, the memory cell 205 may be selectively coupled with the digit line 215 during portions of an access operation. For example, the word line 210 and the selection component 245 of the memory cell 205 may be operable to selectively couple and/or isolate the storage component 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the storage component 240. The plate line 220 may cooperate with the digit line 215 to bias the storage component 240 during access operation of the memory cell 205.

The sense component 250 may determine a state (e.g., a polarization state or a charge) stored on the storage component 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference signal 255 (e.g., a reference voltage). The detected logic state of the memory cell 205 may be provided as an output of the sense component 250 (e.g., to an input/output 260), and may indicate the detected logic state to another component of a memory device 110 that includes the memory die 200. During a read operation, the capacitor of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., reference voltage). The sense component 250 may determine the stored state of the memory cell 205 based on the comparison.

For example, if digit line 215 has a higher voltage than the reference signal 255, the sense component 250 may determine that the stored state of memory cell 205 is a logic 1 and, if the digit line 215 has a lower voltage than the reference signal 255, the sense component 250 may determine that the stored state of the memory cell 205 is a logic 0. In some cases, the reference signal 255 may be generated using an unselected digit line, which may cause the sense component 250 to perform a form of differential sensing using the signal from the selected digit line and the signal from the unselected digit line. The sense component 250 may include various transistors or amplifiers to detect and amplify a difference in the signals. In some cases, the sense component 250 may be part of another component (e.g., a column decoder 230, row decoder 225). In some cases, the sense component 250 may be in electronic communication with the row decoder 225 or the column decoder 230. In some cases, the sense component 250 may be configured to selectively couple with a set of digit lines 215 during a read operation.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the storage component 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference signal 255. Based on that comparison, the sense component 250 may determine a logic state that is stored on the memory cell 205.

Figure 3:
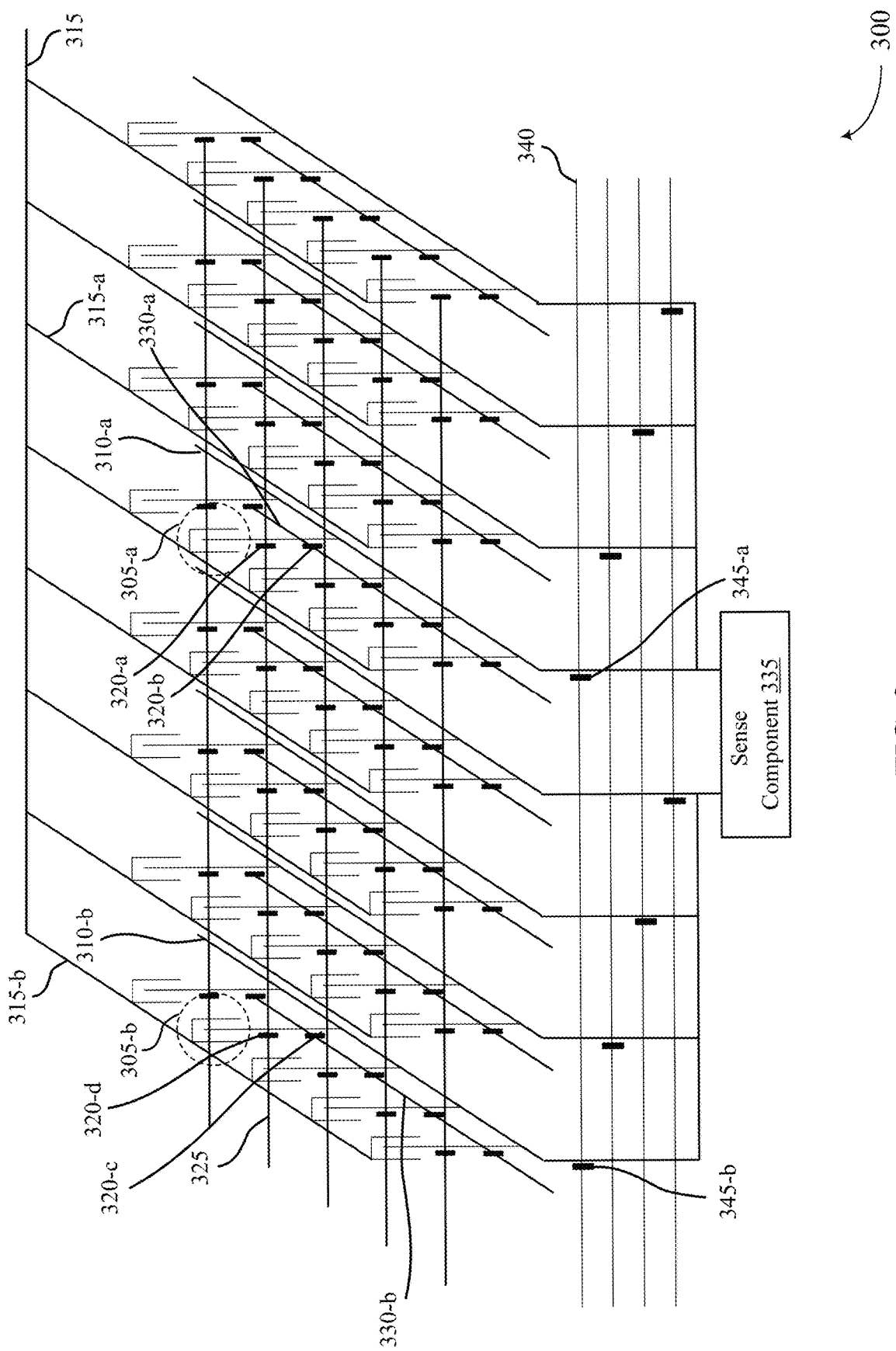
FIG. 3 illustrates an example of a circuit diagram that supports a memory array with multiplexed select lines in accordance with examples as disclosed herein.

FIG. 3 illustrates an example of a circuit diagram 300 that supports memory array with multiplexed select lines in accordance with examples as disclosed herein. The circuit diagram 300 includes memory cells 305 (which may be examples of memory cells 205 described with reference to FIG. 2), digit lines 310 (which may be examples of digit lines 215 described with reference to FIG. 2), plate line 315 (which may be an example of plate line 220 described with reference to FIG. 2), transistors 320 (which may be an example selection component 245 described with reference to FIG. 2), word lines 325 (which may be an example of word lines 210 described with reference to FIG. 2), select lines 330, a sense component 335 (which may be an example of sense component 250 described with reference to FIG. 2). The circuit diagram 300 may illustrate a memory array including forty (40) memory cells, eight (8) digit lines 310, five (5) word lines 325, and eight (8) plate lines 315.

The memory cells 305 may include a storage component (which may be an example of the storage component 240 described with reference to FIG. 2) configured to store a logic state of the memory cell 305. In some cases, the memory cells 305 may be coupled with a digit line 310 and a plate line 315. For example, memory cell 305-a may be coupled with digit line 310-a and plate line 315-a. In another example, memory cell 305-b may be coupled with digit line 310-b and plate line 315-b. In some cases, memory cells 305 may include more than one transistor 320. For example, memory cell 305-a may include two transistors (e.g., transistor 320-a and transistor 320-b). Transistor 320-a and transistor 320-b may be configured in a series configuration. The gate of transistor 320-a may be further coupled with the storage component of memory cell 305-a and word line 325. In such cases, the word line 325 may be configured to select the memory cell 305-a for an access operation. The gate of transistor 320-b may be further coupled with the digit line 310-a and the select line 330-a. In such cases, the select line 330-a may be configured to selectively couple the memory cell 305-a with the digit line 310-a. In one example, transistor 320-a and transistor 320-b may be between the storage component and the digit line 310-a. In other examples, transistor 320-a may be between the storage component and the digit line 310-a and transistor 320-b may be between the storage component and the plate line 315-a.

In other examples, memory cell 305-b may include two transistors (e.g., transistor 320-d and transistor 320-c) where transistors 320-d and transistor 320-c may be configured in a series configuration. The gate of transistor 320-d may be further coupled with the storage component of memory cell 305-b and the word line 325. The gate of transistor 320-c may be further coupled with the digit line 310-b and the select line 330-b. In some cases, transistor 320-c may be configured to selectively couple digit line 310-b with sense component 335. In one example, transistor 320-c and transistor 320-d may be between the storage component and the digit line 310-b. In other examples, transistor 320-d may be between the storage component and the digit line 310-b and transistor 320-c may be between the storage component and the plate line 315-b.

The memory array may receive a command including an instruction to perform a read operation on the memory cell 305-a, for example. The storage component of memory cell 305-a may be coupled with the digit line 310-a when both transistors are activated—e.g., the transistor 320-a activated by the word line 325 and the transistor 320-b activated by the select line 330-a. The locations of the transistor 320-a and the transistor 320-b may be interchangeable. A biased word line 325 may activate or select the memory cells 305 coupled with the biased word line 325 (e.g., memory cell 305-a when the word line 325 is biased to activate the transistor 320-a coupled with the biased word line 325 and memory cell 305-b when the word line 325 is biased to activate the transistor 320-d coupled with the biased word line 325). In such cases, the transistor 320-b may provide an additional degree of freedom as to memory cell 305-a, such that both the word line and the select line are biased to couple the memory cell 305-a with the digit line 310-a.

For example, one of the selected memory cells (e.g., memory cell 305-a) may be coupled with a respective digit line (e.g., digit line 310-a) by biasing (e.g., activating) one of the select lines (e.g., select line 330-a) to activate transistor 320-b and biasing (e.g., activating) one of the word lines (e.g., word line 325), while other memory cells coupled with the word line 325 (e.g., memory cell 305-b) may remain decoupled from the digit lines 310-b based on a biasing one of the select lines (e.g., select line 330-b). For example, the memory cell 305-b may remain isolated from the digit line 310-b based on the bias of the select line 330-b. In some cases, select line 330-b may be coupled with a gate of transistor 320-c and configured to couple memory cell 305-b with sense component 335. Select line 330-a may be parallel to digit line 310-a, and select line 330-b may be parallel to digit line 310-b. In some cases, the additional degree of freedom provided by the transistor 320-b and the transistor 320-c may facilitate sharing the sense component 335 with more than one digit line 310. For example, the sense component 335 may be shared by digit line 310-a and digit line 310-b.

If none of the word lines 325 or select lines 330 are biased, the memory cells 305 may be isolated from the digit line 310, thereby preventing loss of polarization. If a single one of the word lines 325 or the select lines 330 are biased, the memory cells 305 may continue to be isolated from the digit line 310. However, if both one of the word lines 325 and the select lines 330 are biased at a same time for a memory cell 305 (e.g., memory cell 305-a), then the memory cell 305 may be coupled with the digit line 310 and thereby biased to facilitate an access operation (e.g., a read operation or a write operation).

The circuit diagram 300 may include one or more transistors 320 coupled with the digit lines 310 and sense component 335 and configured to selectively couple one or more digit lines 310 with the sense component 335. For example, switch transistor 345-a may selectively couple digit line 310-a with sense component 335. The circuit diagram 300 may also include switch line 340. In some cases, switch line 340 may be referred to as a select line. Switch line 340 may be coupled with a gate of switch transistor 345-a and a gate of switch transistor 345-b. In some cases, switch transistor 345-b may be coupled with digit line 310-b and sense component 335 where switch transistor 345-b may selectively couple digit line 310-b with sense component 335. Switch line 340 may couple a first node of the sense component 335 with digit line 310-a and a second node of sense component 335 with digit line 310-b. Switch line 340 may be activated (e.g., biased) to activate switch transistor 345-a coupled with digit line 310-a and to activate switch transistor 345-b coupled with digit line 310-b. In such cases, a voltage may be applied to the gate of switch transistor 345-a and the gate of switch transistor 345-b via switch line 340 such that the sense component 335 may be coupled to digit line 310-a and digit line 310-a. Thus, a single select line (e.g., switch line 340) may be configured to couple a pair of digit lines 310 to sense component 335, thereby reducing a quantity of select lines 330 in the memory array. In such cases, a single sense component 335 may be coupled with multiple, different digit lines 310.

The sense component 335 may be determine a logic state stored in the memory cell 305-a based on a signal received from digit line 310-a and a signal received from digit line 310-b. The signal received from digit line 310-b may be based on digit line 310-b being decoupled from one or more memory cells 305 because the select line 330-b is biased to cause its associated transistors to be deactivated. The signal received from digit line 310-a may be based on a state stored in the memory cell 305-a based on the word line 325 being biased and the select line 330-a being biased to cause their respective transistors to be activated. In such cases, the sense component 335 may perform an example of a differential sense operation. For example, sense component 335 may determine the logic state using both the selected digit line (e.g., digit line 310-a) and the unselected digit line (e.g., digit line 310-b) using the switch line 340. Using the signal from the unselected digit line as a reference signal may allow the reference signal to track any process variations in the memory device or wear-related variations and thereby provide a more reliable sense operation. The sense component 335 may output the logic state stored in the storage component of the memory cell 305-*a* based on determining the logic state by the sense component 335.

The sense component 335 may determine a logic state stored in the memory cell 305-*b* based on a signal received from digit line 310-*b* and a signal received from digit line 310-*a*. The signal received from digit line 310-*a* may be based on digit line 310-*a* being decoupled from one or more memory cells 305 because the select line 330-*a* is biased to cause its associated transistors to be deactivated. The signal received from digit line 310-*b* may be based on a state stored in the memory cell 305-*b* based on the word line 325 being biased and the select line 330-*b* being biased to cause their respective transistors (e.g., transistor 320-*c*) to be activated. In such cases, the sense component 335 may perform an example of a differential sense operation. For example, sense component 335 may determine the logic state using both the selected digit line (e.g., digit line 310-*b*) and the unselected digit line (e.g., digit line 310-*a*) using the switch line 340. Using the signal from the unselected digit line as a reference signal may allow the reference signal to track any process variations in the memory device or wear-related variations and thereby provide a more reliable sense operation. The sense component 335 may output the logic state stored in the storage component of the memory cell 305-*b* based on determining the logic state by the sense component 335

One or more inputs of the sense component 335 may be selectively coupled with one of a plurality of digit lines 310 using multiplexing techniques that use the select lines (e.g., switch line 340). In some cases, a single select line (e.g., switch line 340) may be configured to couple two digit lines with the sense component 335 using two transistors, one for each digit line. For example, the switch line 340 may be configured to couple a first input of the sense component 335 with the digit line 310-*a* using the switch transistor 345-*a* and a second input of the sense component 335 with the digit line 310-*b* using the switch transistor 345-*b*. In some cases, sharing a sense component 335 among a set of select lines 330 may reduce overall circuit area occupied by the sensing circuitry. Such area reduction may reduce the total area of the memory device, which may facilitate adding different functional circuits (e.g., sub-word line drivers) in the substrate that supports a memory array including the memory cells 305. In some cases, reducing the size of the sense circuitry generally may facilitate building a more sophisticated functionality into the sense component 335—e.g., full-charge extraction function, threshold voltage compensation function. In some cases, the sense component 335 having multiplexed select lines 330 may facilitate leveraging cross-learnings among different memory technologies (e.g., FeRAM, DRAM, 3D XPoint memory) that may utilize such sense component having multiplexed select lines.

Further, the additional degree of freedom provided by the sense component 335 being coupled with a set of multiplexed select lines 330 may alleviate some issues related to using switch lines (e.g. switch line 340) or switch transistors (e.g., switch transistor 345-*a* and switch transistor 345-*b*) in the memory array to mitigate disturbances between selected digit lines and unselected digit lines during an access operation. In some cases, implementing switch lines (e.g. switch line 340) or switch transistors (e.g., switch transistor 345-*a* and switch transistor 345-*b*) in the memory array may result in an increased size of the array, an increase in the occurrence of read disturbs, and an increase in the overall power usage. In the context of memory device including a memory array, read disturbs may refer to adverse effects on logic states stored in memory cells 305 that are coupled with unselected digit lines 310 when digit line 310-*a* (e.g., a digit line next to the unselected digit line 310-*b*) is activated (e.g. coupled with a memory cell 305-*a* to read a logic state stored in the memory cell 305-*a* using a sense component 335). Although part of voltage changes associated with digit line 310-*a* may be coupled (e.g., through capacitive coupling) to digit line 310-*b*, the logic states stored in the other memory cells 305 may be protected from such voltage changes.

In some memory systems, switch lines (e.g. switch line 340) and switch transistors (e.g., switch transistor 345-*a* and switch transistor 345-*b*) may be used to mitigate disturbances on memory cells caused by coupling between digit lines or coupling between digit lines and plate lines during access operation. Switch lines (e.g. switch line 340) and switch transistors (e.g., switch transistor 345-*a* and switch transistor 345-*b*) consume die area and consume power that could be used for other circuitry, such as additional memory cells of a memory array. To reduce the quantity of switch lines (e.g. switch line 340) and switch transistors (e.g., switch transistor 345-*a* and switch transistor 345-*b*), a memory cell may be configured with two transistors coupled with the word line 325 and the select line 330 respectively, and the switch line 340 may be configured to couple two digit lines 310 with the sense component 335 at one time. In this manner, read disturbs may be mitigated by the memory cell 305 that includes two transistors and by reducing an amount of switch lines (e.g. switch line 340) or switch transistors (e.g., switch transistor 345-*a* and switch transistor 345-*b*), thereby decreasing an area occupied by a memory array, decreasing the cost of the memory array, and removing the switch power. In such cases, the select lines (e.g., switch line 340) may be closer to the sense component 335 as compared to a distance when the switch lines or switch transistors may be present such that the sense component 335 may use the select lines 330 as a reference voltage.

Figure 4A:
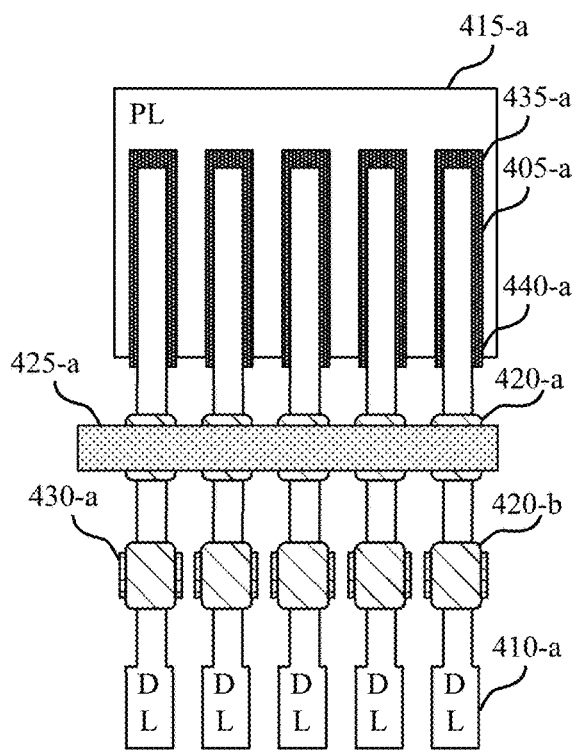
FIGS. 4A-4D illustrate examples of cross-sectional side views of a portion of a memory array with multiplexed select lines in accordance with examples as disclosed herein.

FIG. 4A illustrates an example of a cross-sectional side view 400-*a* of a portion of a memory array with multiplexed select lines in accordance with examples as disclosed herein. The cross-sectional side view 400-*a* illustrates an example of a configuration of a memory cell that includes two transistors. The cross-sectional side view 400-*a* depicts a digit line 410-*a* (which may be examples of digit lines 215 or digit line 310 described with reference to FIGS. 2 and 3), a plate line 415-*a* (which may be an example of plate line 220 or plate line 315 described with reference to FIGS. 2 and 3), transistor 420-*a* and transistor 420-*b* (which may be examples selection component 245 or transistor 320 described with reference to FIGS. 2 and 3), word line 425-*a* (which may be an example of word lines 210 or word lines 325 described with reference to FIGS. 2 and 3), and select line 430-*a* (which may be an example of select lines 330 described with reference to FIG. 3). Further, the cross-sectional side view 400-*a* depicts a storage component 405-*a* (e.g., container) included in a memory cell (which may be an example of memory cell 205 or memory cell 305 described with reference to FIGS. 2 and 3).

The storage component 405-*a* may include a first end 435-*a* and a second end 440-*a*. The first end 435-*a* may be coupled with the plate line 415-*a*. The second end 440-*a* may be coupled with the transistor 420-*a*. In such cases, the storage component 405-*a* of the memory cell may be concave down with respect to a top surface of the plate line 415-*a*. The shape of the memory cell (e.g., concavity of the storage component 405-*a*) may be configured to isolate the memory cell from an adjacent memory cell. For example, the shape of the memory cell may be configured to isolate digit line 410-*a* from plate line 415-*a*. In some examples, the shape of the memory cell (e.g., concavity of the storage component 405-*a*) may be configured to short memory cells together.

The portion of the memory array may include two transistors (e.g., transistor 420-*a* and transistor 420-*b*). Transistors 420-*a* and 420-*b* may be arranged in a series configuration. For example, transistor 420-*a* may be coupled with the storage component 405-*a* and transistor 420-*b* may be coupled with digit line 410-*a*. In such cases, the first transistor (e.g., transistor 420-*a*) and second transistor (e.g., transistor 420-*b*) may be between the storage component 405-*a* and the digit line 410-*a*. A gate of transistor 420-*a* may be coupled with word line 425-*a*. A gate of transistor 420-*b* may be coupled with the select line 430-*a*.

When both transistors (e.g., transistor 420-*a* and transistor 420-*b*) are on one side of the storage component 405-*a*, the operation of the memory cell may be different than when one transistor is on one side of the storage component 405-*a* and the other transistor is on the other side of the storage component 405-*a*. For example, a refresh operation may occur at the memory cell where the memory cell may store charge in the capacitor. The mechanism of discharging the charge from the memory cell via leakage and disturbs may be a different mechanism than if one transistor is on one side of the storage component 405-*a* and the one transistor on the other side of the storage component 405-*a*.

In some examples, the digit line 410-*a* may extend in a direction parallel to select line 430-*a* (e.g., may extend in and out of the page as depicted by FIG. 4A). The digit line 410-*a* and the select line 430-*a* may extend in a direction perpendicular to the word line 425-*a* and the plate line 415-*a* (e.g., which may extend across the page as depicted in FIG. 4A). The word line 425-*a* may extend in a direction parallel to the plate line 415-*a*.

Figure 4B:
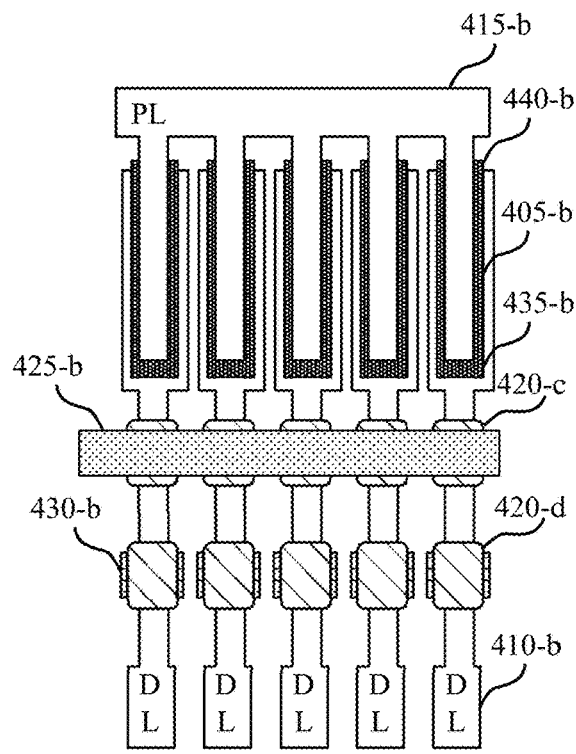

FIG. 4B illustrates an example of a cross-sectional side view 400-*b* of a portion of a memory array with multiplexed select lines in accordance with examples as disclosed herein. The cross-sectional side view 400-*b* illustrates an example of a configuration of a memory cell that includes two transistors. The cross-sectional side view 400-*b* depicts a digit line 410-*b* (which may be examples of digit lines 215 or digit line 310 described with reference to FIGS. 2 and 3), a plate line 415-*b* (which may be an example of plate line 220 or plate line 315 described with reference to FIGS. 2 and 3), transistor 420-*c* and transistor 420-*d* (which may be examples selection component 245 or transistor 320 described with reference to FIGS. 2 and 3), word line 425-*b* (which may be an example of word lines 210 or word lines 325 described with reference to FIGS. 2 and 3), and select line 430-*b* (which may be an example of select lines 330 described with reference to FIG. 3). Further, the cross-sectional side view 400-*b* depicts a storage component 405-*b* (e.g., container) included in a memory cell (which may be an example of memory cell 205 or memory cell 305 described with reference to FIGS. 2 and 3).

The storage component 405-*b* may include a first end 435-*b* and a second end 440-*b*. The first end 435-*b* may be coupled with transistor 420-*c*. The second end 440-*b* may be coupled with plate line 415-*b*. In such cases, the storage component 405-*b* of the memory cell may be concave up with respect to a top surface of the plate line 415-*b*. The shape of the memory cell (e.g., concavity of the storage component 405-*b*) may be configured to isolate the memory cell from an adjacent memory cell. For example, the shape of the memory cell may be configured to isolate digit line 410-*b* from plate line 415-*b*. In some examples, the shape of the memory cell (e.g., concavity of the storage component 405-*b*) may be configured to short memory cells together.

The portion of the memory array may include two transistors (e.g., transistor 420-*c* and transistor 420-*d*). Transistors 420-*c* and 420-*d* may be arranged in a series configuration. For example, transistor 420-*c* may be coupled with the storage component 405-*b* and transistor 420-*d* may be coupled with digit line 410-*b*. In such cases, the first transistor (e.g., transistor 420-*c*) and second transistor (e.g., transistor 420-*d*) may be between the storage component 405-*b* and the digit line 410-*b*. A gate of transistor 420-*c* may be coupled with word line 425-*b*. A gate of transistor 420-*d* may be coupled with select line 430-*b*.

When both transistors (e.g., transistor 420-*c* and transistor 420-*d*) are on one side of the storage component 405-*b*, the operation of the memory cell may be different than when one transistor is on one side of the storage component 405-*b* and the other transistor is on the other side of the storage component 405-*b*. For example, a refresh operation may occur at the memory cell where the memory cell may store charge in the capacitor. The mechanism of discharging the charge from the memory cell via leakage and disturbs may be a different mechanism than if one transistor is on one side of the storage component 405-*b* and the one transistor on the other side of the storage component 405-*b*.

In some examples, the digit line 410-*b* may extend in a direction parallel to select line 430-*b* (e.g., may extend in and out of the page as depicted in FIG. 4B). The digit line 410-*b* and the select line 430-*b* may extend in a direction perpendicular to the word line 425-*b* and the plate line 415-*b* (e.g., which may extend across the page as depicted in FIG. 4B). The word line 425-*b* may extend in a direction parallel to the plate line 415-*b*.

Figure 4C:
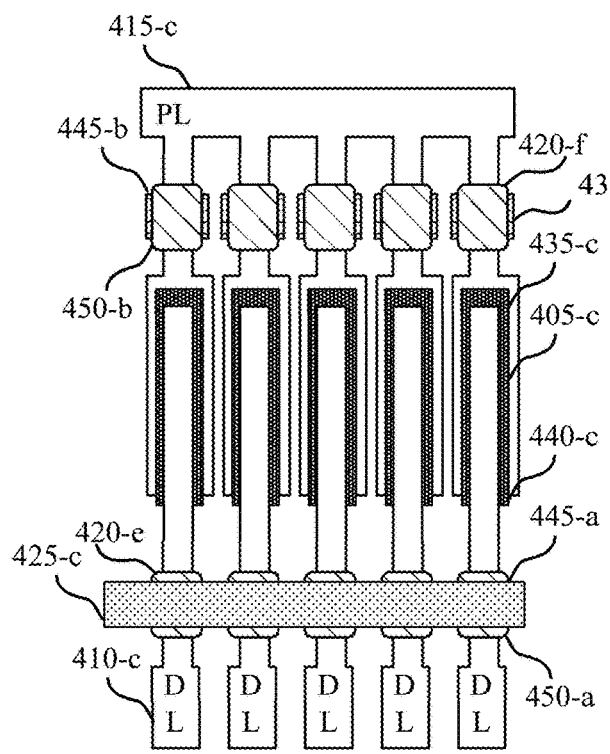

FIG. 4C illustrates an example of a cross-sectional side view 400-*c* of a portion of a memory array with multiplexed select lines in accordance with examples as disclosed herein. The cross-sectional side view 400-*b* illustrates an example of a configuration of a memory cell that includes two transistors. The cross-sectional side view 400-*c* depicts a digit line 410-*c* (which may be examples of digit lines 215 or digit line 310 described with reference to FIGS. 2 and 3), a plate line 415-*c* (which may be an example of plate line 220 or plate line 315 described with reference to FIGS. 2 and 3), transistor 420-*e* and transistor 420-*f* (which may be examples selection component 245 or transistor 320 described with reference to FIGS. 2 and 3), word line 425-*c* (which may be an example of word lines 210 or word lines 325 described with reference to FIGS. 2 and 3), and select line 430-*c* (which may be an example of select lines 330 described with reference to FIG. 3). Further, the cross-sectional side view 400-*c* depicts a storage component 405-*c* (e.g., container) included in a memory cell (which may be an example of memory cell 205 or memory cell 305 described with reference to FIGS. 2 and 3).

The storage component 405-*c* may include a first end 435-*c* and a second end 440-*c*. The first end 435-*c* may be coupled with transistor 420-*f*. The second end 440-*c* may be coupled with transistor 420-*e*. In such cases, the storage component 405-*c* of the memory cell may be concave down with respect to a top surface of the plate line 415-*c*. The shape of the memory cell (e.g., concavity of the storage component 405-*c*) may be configured to isolate the memory cell from an adjacent memory cell. For example, the shape of the memory cell may be configured to isolate digit line 410-*c* from plate line 415-*c*. In some examples, the shape of the memory cell (e.g., concavity of the storage component 405-*c*) may be configured to short memory cells together.

The portion of the memory array may include two transistors (e.g., transistor 420-*e* and transistor 420-*f*). Transistor 420-*e* may include a first node 445-*a* and a second node 450-*a*. The first node 445-*a* of transistor 420-*e* may be coupled with the storage component 405-*c*. The second node 450-*a* may be coupled with digit line 410-*c*. In such cases, the transistor 420-*e* may be coupled between the storage component 405-*c* and the digit line 410-*c*. Transistor 420-*f* may include a first node 445-*b* and a second node 450-*b*. The first node 445-*b* of transistor 420-*f* may be coupled with plate line 415-*c*. The second node 450-*b* may be coupled with the storage component 405-*c*. In such cases, the transistor 420-*f* may be coupled between the storage component 405-*c* and the plate line 415-*c*. A gate of transistor 420-*e* may be coupled with word line 425-*c*. A gate of transistor 420-*f* may be coupled with select line 430-*c*.

When both transistors (e.g., transistor 420-*e* and transistor 420-*f*) are on one side of the storage component 405-*c*, the operation of the memory cell may be different when one transistor is on one side of the storage component 405-*c* and the other transistor is on the other side of the storage component 405-*c*. For example, a refresh operation may occur at the memory cell where the memory cell may store charge in the capacitor. The mechanism of discharging the charge from the memory cell via leakage and disturbs may be a different mechanism than if both transistors are on one side of the storage component 405-*c*.

In some examples, the digit line 410-*c* may extend in a direction parallel to select line 430-*c* (e.g., may extend in and out of the page as depicted by FIG. 4C). The digit line 410-*c* and the select line 430-*c* may extend in a direction perpendicular to the word line 425-*c* and the plate line 415-*c* (e.g., which may extend across the page as depicted in FIG. 4C). The word line 425-*c* may extend in a direction parallel to the plate line 415-*c*.

Figure 4D:
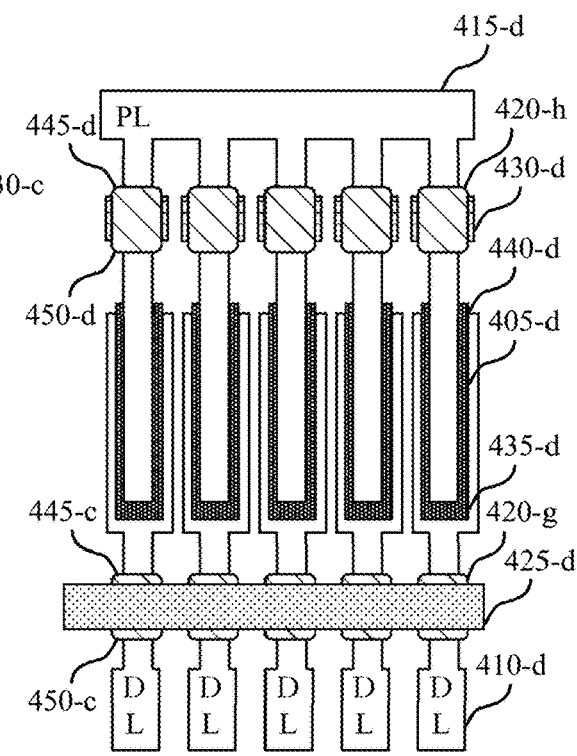

FIG. 4D illustrates an example of a cross-sectional side view 400-*d* of a portion of a memory array with multiplexed select lines in accordance with examples as disclosed herein. The cross-sectional side view 400-*d* illustrates an example of a configuration of a memory cell that includes two transistors. The cross-sectional side view 400-*d* depicts a digit line 410-*d* (which may be examples of digit lines 215 or digit line 310 described with reference to FIGS. 2 and 3), a plate line 415-*d* (which may be an example of plate line 220 or plate line 315 described with reference to FIGS. 2 and 3), transistor 420-*g* and transistor 420-*h* (which may be examples selection component 245 or transistor 320 described with reference to FIGS. 2 and 3), word line 425-*d* (which may be an example of word lines 210 or word lines 325 described with reference to FIGS. 2 and 3), and select line 430-*d* (which may be an example of select lines 330 described with reference to FIG. 3). Further, the cross-sectional side view 400-*d* depicts a storage component 405-*d* (e.g., container) included in a memory cell (which may be an example of memory cell 205 or memory cell 305 described with reference to FIGS. 2 and 3).

The storage component 405-*d* may include a first end 435-*d* and a second end 440-*d*. The first end 435-*d* may be coupled with transistor 420-*g*. The second end 440-*d* may be coupled with transistor 420-*h*. In such cases, the storage component 405-*d* of the memory cell may be concave up with respect to a top surface of the plate line 415-*d*. The shape of the memory cell (e.g., concavity of the storage component 405-*d*) may be configured to isolate the memory cell from an adjacent memory cell. For example, the shape of the memory cell may be configured to isolate digit line 410-*d* from plate line 415-*d*. In some examples, the shape of the memory cell (e.g., concavity of the storage component 405-*d*) may be configured to short memory cells together.

The portion of the memory array may include two transistors (e.g., transistor 420-*g* and transistor 420-*h*). Transistor 420-*g* may include a first node 445-*c* and a second node 450-*c*. The first node 445-*c* of transistor 420-*g* may be coupled with the storage component 405-*d*. The second node 450-*c* may be coupled with digit line 410-*d*. In such cases, the transistor 420-*g* may be coupled between the storage component 405-*d* and the digit line 410-*d*. Transistor 420-*h* may include a first node 445-*d* and a second node 450-*d*. The first node 445-*d* of transistor 420-*h* may be coupled with plate line 415-*d*. The second node 450-*d* may be coupled with the storage component 405-*d*. In such cases, the transistor 420-*g* may be coupled between the storage component 405-*d* and the plate line 415-*d*. A gate of transistor 420-*g* may be coupled with word line 425-*d*. A gate of transistor 420-*h* may be coupled with select line 430-*d*.

When both transistors (e.g., transistor 420-*g* and transistor 420-*h*) are on one side of the storage component 405-*d*, the operation of the memory cell may be different when one transistor is on one side of the storage component 405-*d* and the other transistor is on the other side of the storage component. For example, a refresh operation may occur at the memory cell where the memory cell may store charge in the capacitor. The mechanism of discharging the charge from the memory cell via leakage and disturbs may be a different mechanism than if both transistors are on one side of the storage component 405-*d*.

In some examples, the digit line 410-*d* may extend in a direction parallel to select line 430-*d* (e.g., may extend in and out of the page as depicted by FIG. 4D). The digit line 410-*d* and the select line 430-*d* may extend in a direction perpendicular to the word line 425-*d* and the plate line 415-*d* (e.g., which may extend across the page as depicted in FIG. 4D). The word line 425-*d* may extend in a direction parallel to the plate line 415-*d*.

Figure 5:
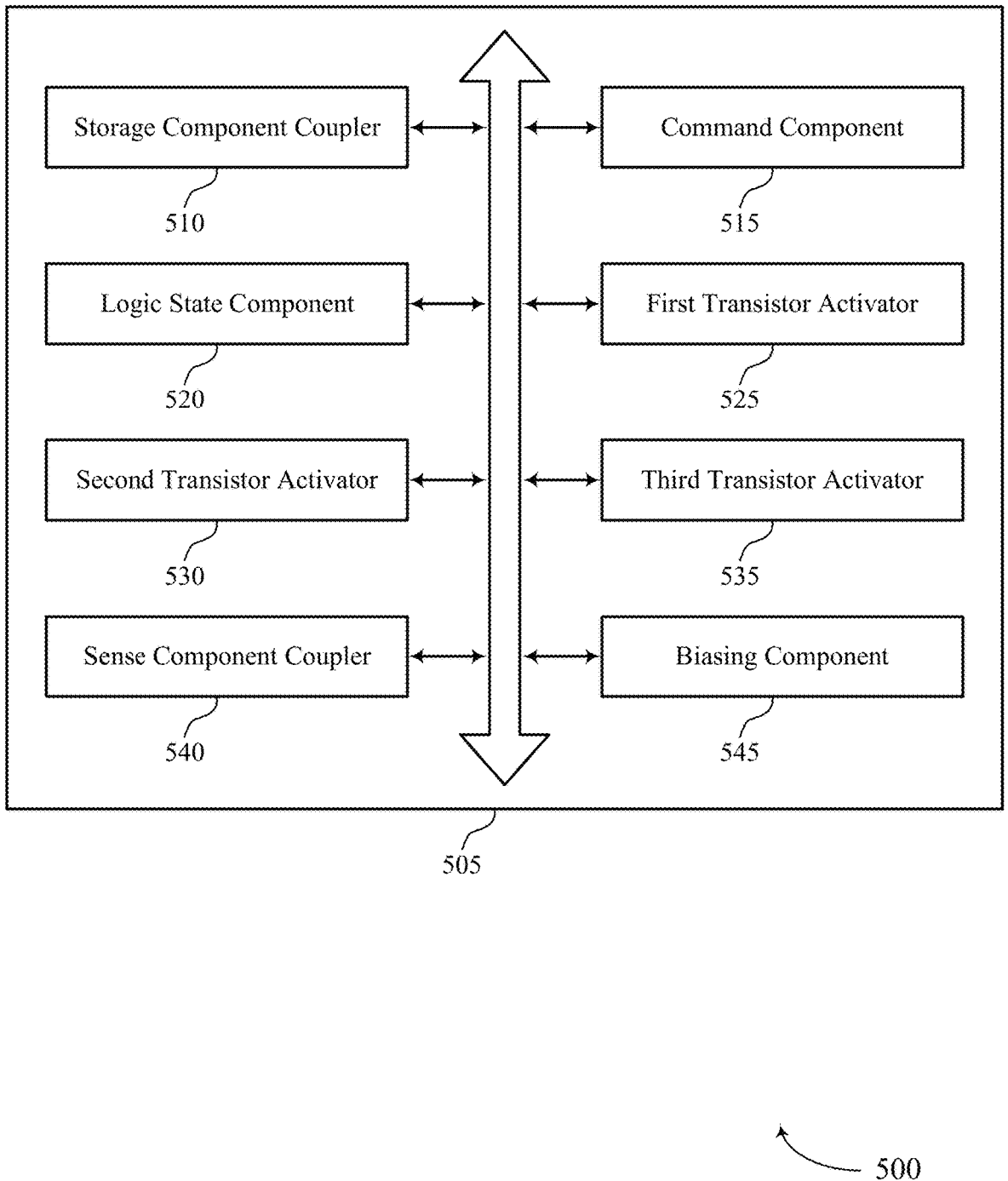
FIG. 5 shows a block diagram of a memory device that supports a memory array with multiplexed select lines in accordance with examples as disclosed herein.

FIG. 5 shows a block diagram 500 of a memory device 505 that supports memory array with multiplexed select lines in accordance with examples as disclosed herein. The memory device 505 may be an example of aspects of a memory device as described with reference to FIGS. 1 through 4. The memory device 505 may include a storage component coupler 510, a command component 515, a logic state component 520, a first transistor activator 525, a second transistor activator 530, a third transistor activator 535, a sense component coupler 540, and a biasing component 545. Each of these modules may communicate, directly or indirectly, with one another (e.g., via one or more buses).

The storage component coupler 510 may couple a storage component of the memory cell with a first digit line based on biasing the word line and the first select line.

The logic state component 520 may determine, using the sense component, a logic state stored on the memory cell based on a first signal received from the first digit line and a second signal received from the second digit line. In some examples, the logic state component 520 may output, by the sense component, the logic state stored in the storage component of the memory cell based on determining the logic state by the sense component.

The first transistor activator 525 may bias a word line to activate a first transistor of a memory cell coupled with the word line.

The second transistor activator 530 may bias a first select line to activate a second transistor of the memory cell coupled with the first select line.

The third transistor activator 535 may bias a second select line to activate a third transistor coupled with the first digit line and a fourth transistor coupled with a second digit line. In some examples, the third transistor activator 535 may apply a voltage to a first gate of the third transistor and a second gate of the fourth transistor.

The sense component coupler 540 may couple the first digit line with a sense component and the second digit line with the sense component based on biasing the second select line. In some examples, the sense component coupler 540 may couple a first node of the sense component with the first digit line and coupling a second node of the sense component with the second digit line based on applying the voltage.

The command component 515 may receive a command including an instruction to perform a read operation on the memory cell, where biasing the word line, the first select line, and the second select line are based on receiving the command.

The biasing component 545 may bias a third select line to decouple one or more memory cells from the second digit line based on biasing the second select line, where the second signal is based on the second digit line being decoupled from the one or more memory cells.

Figure 6:
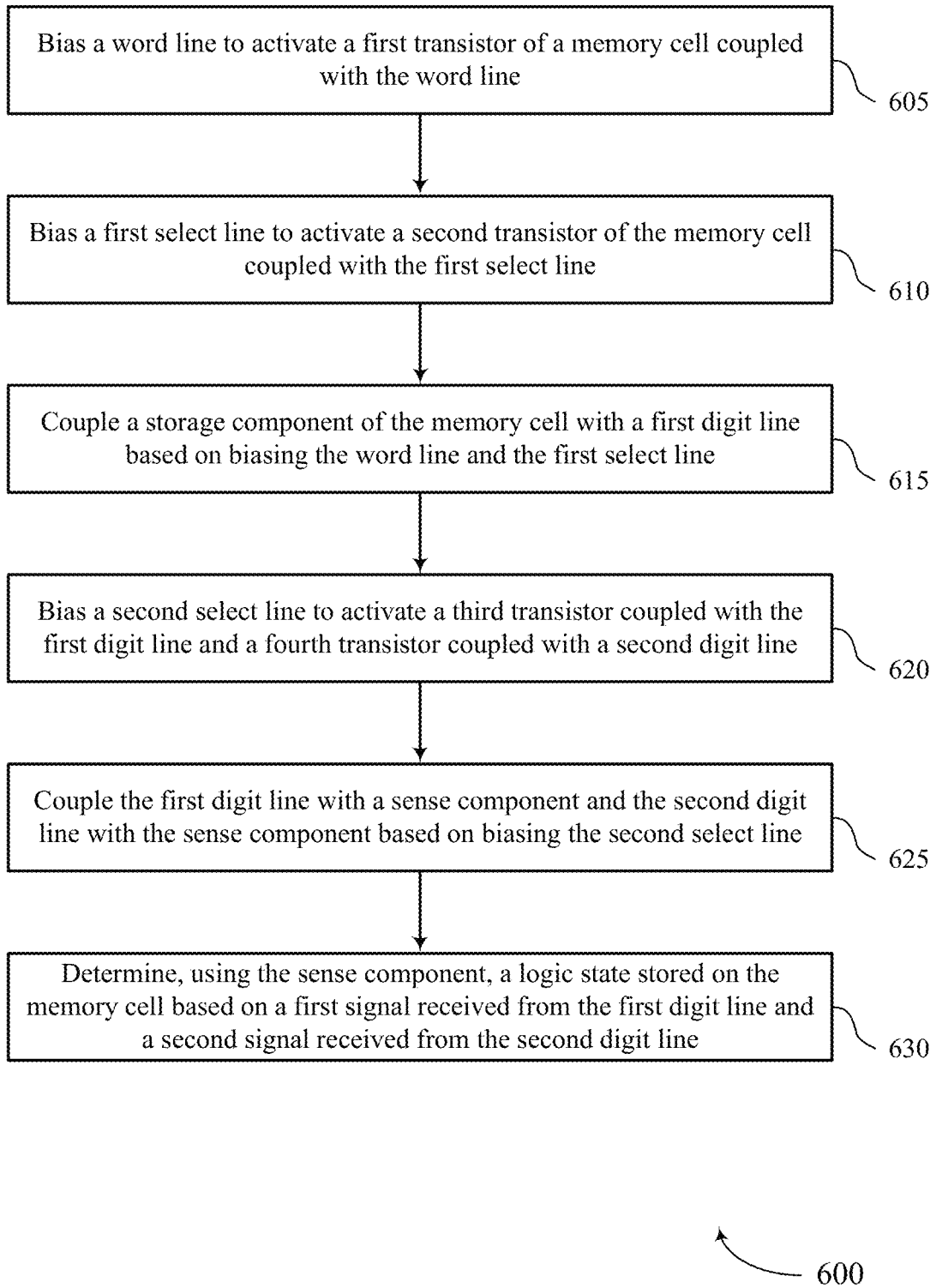
FIG. 6 shows a flowchart illustrating a method or methods that support a memory array with multiplexed select lines in accordance with examples as disclosed herein.

FIG. 6 shows a flowchart illustrating a method or methods 600 that supports memory array with multiplexed select lines in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may bias a word line to activate a first transistor of a memory cell coupled with the word line. The operations of 605 may be performed according to the methods described herein. In some examples, aspects of the operations of 605 may be performed by a first transistor activator as described with reference to FIG. 5.

At 610, the memory device may bias a first select line to activate a second transistor of the memory cell coupled with the first select line. The operations of 610 may be performed according to the methods described herein. In some examples, aspects of the operations of 610 may be performed by a second transistor activator as described with reference to FIG. 5.

At 615, the memory device may couple a storage component of the memory cell with a first digit line based on biasing the word line and the first select line. The operations of 615 may be performed according to the methods described herein. In some examples, aspects of the operations of 615 may be performed by a storage component coupler as described with reference to FIG. 5.

At 620, the memory device may bias a second select line to activate a third transistor coupled with the first digit line and a fourth transistor coupled with a second digit line. The operations of 620 may be performed according to the methods described herein. In some examples, aspects of the operations of 620 may be performed by a third transistor activator as described with reference to FIG. 5.

At 625, the memory device may couple the first digit line with a sense component and the second digit line with the sense component based on biasing the second select line. The operations of 625 may be performed according to the methods described herein. In some examples, aspects of the operations of 625 may be performed by a sense component coupler as described with reference to FIG. 5.

At 630, the memory device may determine, using the sense component, a logic state stored on the memory cell based on a first signal received from the first digit line and a second signal received from the second digit line. The operations of 630 may be performed according to the methods described herein. In some examples, aspects of the operations of 630 may be performed by a logic state component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for biasing a word line to activate a first transistor of a memory cell coupled with the word line, biasing a first select line to activate a second transistor of the memory cell coupled with the first select line, coupling a storage component of the memory cell with a first digit line based on biasing the word line and the first select line, biasing a second select line to activate a third transistor coupled with the first digit line and a fourth transistor coupled with a second digit line, coupling the first digit line with a sense component and the second digit line with the sense component based on biasing the second select line, and determining, using the sense component, a logic state stored on the memory cell based on a first signal received from the first digit line and a second signal received from the second digit line.

Some examples of the method 600 and the apparatus described herein may further include operations, features, means, or instructions for biasing a third select line to decouple one or more memory cells from the second digit line based on biasing the second select line, where the second signal may be based on the second digit line being decoupled from the one or more memory cells.

Some examples of the method 600 and the apparatus described herein may further include operations, features, means, or instructions for outputting, by the sense component, the logic state stored in the storage component of the memory cell based on determining the logic state by the sense component.

Some examples of the method 600 and the apparatus described herein may further include operations, features, means, or instructions for applying a voltage to a first gate of the third transistor and a second gate of the fourth transistor, and coupling a first node of the sense component with the first digit line and coupling a second node of the sense component with the second digit line based on applying the voltage.

Some examples of the method 600 and the apparatus described herein may further include operations, features, means, or instructions for receiving a command including an instruction to perform a read operation on the memory cell, where biasing the word line, the first select line, and the second select line may be based on receiving the command.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an array of memory cells, a controller coupled with the array of memory cells and operable to, bias a word line to activate a first transistor of a memory cell coupled with the word line, bias a first select line to activate a second transistor of the memory cell coupled with the first select line, couple a storage component of the memory cell with a first digit line based on biasing the word line and the first select line, bias a second select line to activate a third transistor coupled with the first digit line and a fourth transistor coupled with a second digit line, couple the first digit line with a sense component and the second digit line with the sense component based on biasing the second select line, and determine, using the sense component, a logic state stored on the memory cell based on a first signal received from the first digit line and a second signal received from the second digit line.

Some examples may further include biasing a third select line to decouple one or more memory cells from the second digit line based on biasing the second select line, where the second signal may be based on the second digit line being decoupled from the one or more memory cells.

Some examples may further include outputting, by the sense component, the logic state stored in the storage component of the memory cell based on determining the logic state by the sense component.

Some examples may further include applying a voltage to a first gate of the third transistor and a second gate of the fourth transistor, and coupling a first node of the sense component with the first digit line and coupling a second node of the sense component with the second digit line based on applying the voltage.

Some examples may further include receiving a command including an instruction to perform a read operation on the memory cell, where biasing the word line, the first select line, and the second select line may be based on receiving the command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory device, comprising:
a first memory cell coupled with a first digit line and a plate line, the first memory cell comprising a storage component, a first transistor, and a second transistor;
a word line coupled with a first gate of the first transistor;
a first select line coupled with a second gate of the second transistor, wherein the first select line extends in a direction perpendicular to the word line;
a third transistor coupled with the first digit line and a first node of a sense component and configured to selectively couple the first digit line with the first node of the sense component;
a fourth transistor coupled with a second digit line and a second node of the sense component and configured to selectively couple the second digit line with the second node of the sense component, wherein the first digit line and the second digit line extend in a direction parallel to the first select line;
a second select line coupled with a third gate of the third transistor and a fourth gate of the fourth transistor, the second select line configured to activate the third transistor to couple the first node of the sense component with the first digit line and to activate the fourth transistor to couple the second node of the sense component with the second digit line; and
a second memory cell coupled with the word line and the second digit line;
wherein:
the second transistor is coupled between the plate line and the storage component of the first memory cell;
the storage component is coupled between the second transistor and the first transistor; and the first transistor is coupled between the storage component and the first digit line.

2. The memory device of claim 1, wherein:
the storage component, the first transistor, and the second transistor of the first memory cell are configured in a series configuration.

3. The memory device of claim 1, wherein:
the first node is coupled with the first digit line and the second node is coupled with the second digit line based at least in part on applying a voltage to the third gate of the third transistor and the fourth gate of the fourth transistor.

4. The memory device of claim 1, wherein:
the second memory cell comprises a second storage component, a fifth transistor, and a sixth transistor, wherein the fourth transistor is coupled with the second digit line and the sense component and configured to selectively couple the second digit line with the sense component.

5. The memory device of claim 4, further comprising:
a third select line coupled with a fifth gate of the fifth transistor and configured to couple the second memory cell with the sense component.

6. The memory device of claim 1, wherein the sense component is configured to determine a logic state stored in the first memory cell based at least in part on a first signal received from the first digit line and a second signal received from the second digit line, wherein the sense component performs a differential sensing operation based at least in part on the first signal and the second signal.

7. A method, comprising:
biasing a word line to activate a first transistor of a first memory cell coupled with the word line;
biasing a first select line to activate a second transistor of the first memory cell coupled with the first select line, wherein the first select line extends in a direction perpendicular to the word line;
coupling a storage component of the first memory cell with a first digit line based at least in part on biasing the word line and the first select line;
coupling the storage component of the first memory cell with a plate line based at least in part on biasing the first select line;
coupling the first digit line with a first node of a sense component using a second select line and a third transistor based at least in part on coupling the storage component with the first digit line;
determining, using the sense component, a logic state stored on the first memory cell based at least in part on coupling the first digit line with the sense component;
biasing a third select line to activate a fourth transistor of a second memory cell coupled with the third select line based at least in part on determining the logic state; and
coupling a second storage component of the second memory cell with a second digit line based at least in part on biasing the word line and the third select line, wherein the first digit line and the second digit line each extend in a direction parallel to the first select line and the third select line.

8. The method of claim 7, further comprising:
biasing the third select line to decouple one or more additional memory cells from the second digit line based at least in part on biasing the second select line, wherein a second signal received from the second digit line is based at least in part on the second digit line being decoupled from the one or more additional memory cells.

9. The method of claim 7, further comprising:
receiving a command to perform a read operation on the first memory cell,
wherein biasing the word line, the first select line, and the second select line are based at least in part on receiving the command; and
outputting, by the sense component, the logic state stored in the storage component of the first memory cell based at least in part on determining the logic state by the sense component.

10. The method of claim 7, further comprising:
applying a voltage to a first gate of the third transistor and a second gate of a fifth transistor coupled with the second select line and the second digit line; and
coupling the first node of the sense component with the first digit line and coupling a second node of the sense component with the second digit line based at least in part on applying the voltage.

11. An apparatus, comprising:
an array of memory cells comprising a first memory cell and a second memory cell; and
a controller coupled with the array of memory cells and operable to:
bias a word line to activate a first transistor of the first memory cell coupled with the word line;
bias a first select line to activate a second transistor of the first memory cell coupled with the first select line, wherein the first select line extends in a direction perpendicular to the word line;
couple a storage component of the first memory cell with a first digit line based at least in part on biasing the word line and the first select line;
couple the storage component of the first memory cell with a plate line based at least in part on biasing the first select line;
couple the first digit line with a first node of a sense component using a second select line and a third transistor based at least in part on coupling the storage component with the first digit line;
determine, using the sense component, a logic state stored on the first memory cell based at least in part on coupling the first digit line with the sense component;
bias a third select line to activate a fourth transistor of the second memory cell coupled with the third select line based at least in part on determining the logic state; and
couple a second storage component of the second memory cell with a second digit line based at least in part on biasing the word line and the third select line, wherein the first digit line and the second digit line each extend in a direction parallel to the first select line and the third select line.

12. The apparatus of claim 11, wherein the controller is further operable to:
bias the third select line to decouple one or more additional memory cells from the second digit line based at least in part on biasing the second select line, wherein a second signal received from the second digit line is based at least in part on the second digit line being decoupled from the one or more additional memory cells.

13. The apparatus of claim 11, wherein the controller is further operable to:
receive a command to perform a read operation on the first memory cell, wherein biasing the word line, the first select line, and the second select line are based at least in part on receiving the command; and output, by the sense component, the logic state stored in the storage component of the first memory cell based at least in part on determining the logic state by the sense component.

14. The apparatus of claim 11, wherein the controller is further operable to:

apply a voltage to a first gate of the third transistor and a second gate of a fifth transistor coupled with the second select line and the second digit line; and couple the first node of the sense component with the first digit line and couple a second node of the sense component with the second digit line based at least in part on applying the voltage.

* * * * *